United States Patent
Lin et al.

(10) Patent No.: US 10,418,946 B2
(45) Date of Patent: Sep. 17, 2019

(54) DUAL HYSTERETIC CONTROL LOOP OF ENVELOPE TRACKING

(71) Applicant: AVAGO TECHNOLOGIES INTERNATIONAL SALES PTE. LIMITED

(72) Inventors: Xiaofeng Lin, Irvine, CA (US); Leon Samuel Wang, Irvine, CA (US); Shengyuan Li, Irvine, CA (US); Junjie Lu, Irvine, CA (US); Xicheng Jiang, Irvine, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/864,400

(22) Filed: Jan. 8, 2018

(65) Prior Publication Data

US 2018/0198415 A1    Jul. 12, 2018

Related U.S. Application Data

(60) Provisional application No. 62/443,223, filed on Jan. 6, 2017.

(51) Int. Cl.
*H03F 3/217* (2006.01)
*H03F 1/02* (2006.01)
*H03F 3/21* (2006.01)
*H03F 3/19* (2006.01)

(52) U.S. Cl.
CPC ............ *H03F 1/0222* (2013.01); *H03F 3/19* (2013.01); *H03F 3/21* (2013.01); *H03F 3/2173* (2013.01); *H03F 2200/102* (2013.01); *H03F 2200/387* (2013.01); *H03F 2200/451* (2013.01); *H03F 2200/462* (2013.01); *H03F 2200/471* (2013.01); *H03F 2200/78* (2013.01)

(58) Field of Classification Search
CPC ....................................................... H03F 3/217
USPC .............................................. 330/251, 207 A
See application file for complete search history.

(56) References Cited

U.S. PATENT DOCUMENTS

| | | | | |
|---|---|---|---|---|
| 5,886,581 | A * | 3/1999 | Hugel | H03F 1/303 330/136 |
| 6,469,917 | B1 * | 10/2002 | Ben-Yaakov | H02M 1/4225 323/222 |
| 6,583,664 | B2 * | 6/2003 | Mathe | H03F 1/0222 330/10 |
| 7,567,127 | B2 * | 7/2009 | Hsieh | H03G 3/30 330/291 |
| 8,471,533 | B2 * | 6/2013 | Hussain | H02J 7/0073 320/164 |
| 8,866,453 | B2 * | 10/2014 | Lyle, Jr. | H02M 3/156 323/266 |
| 9,385,669 | B2 * | 7/2016 | Banerjee | H03F 3/193 |
| 2016/0065148 | A1 * | 3/2016 | Liu | H03F 3/211 330/251 |

* cited by examiner

*Primary Examiner* — Henry Choe
(74) *Attorney, Agent, or Firm* — XSensus LLP

(57) ABSTRACT

An envelope tracking device includes circuitry that senses a current of an input state of the envelope tracking device. The circuitry also senses an output voltage of the envelope tracking device, and turns on at least one of a first and a second output switches to generate an output current based on at least one of the sensed current and the sensed voltage.

18 Claims, 3 Drawing Sheets

DUAL HYSTERETIC CONTROL LOOP OF ENVELOPE TRACKING

CROSS-REFERENCE TO RELATED APPLICATIONS

This application claims the benefit of priority to provisional application No. 62/443,223 filed Jan. 6, 2017, the entire contents of which are incorporated herein by reference.

BACKGROUND

Technical Field

This disclosure relates to envelope tracking circuits that may be used, for example, in wireless communication devices.

Description of the Related Art

Rapid advances in electronics and communication technologies, driven by immense customer demand, have resulted in the widespread adoption of mobile communication devices. The extent of the proliferation of such devices is readily apparent in view of some estimates that indicate that the number of wireless subscriber connections is nearly equal to the population of the entire world. Improvements in wireless communication devices will help continue to make such devices attractive options for the consumer.

BRIEF DESCRIPTION OF THE DRAWING

A more complete appreciation of this disclosure and many of the attendant advantages thereof will be readily obtained as the same becomes better understood by reference to the following detailed description when considered in connection with the accompanying drawings, wherein.

DETAILED DESCRIPTION

The discussion below makes reference to envelope tracking power supplies in devices that include RF amplifiers such as user equipment (UE). UE may take many different forms and have many different functions. As one example, UE may be a 2G, 3G, 4G/LTE, or 5G cellular phone capable of making and receiving wireless phone calls, and transmitting and receiving data. The UE may also be a smartphone that, in addition to making and receiving phone calls, runs any number or type of applications. The UE may be a connectivity platform supporting Wireless LAN (WLAN), Bluetooth and other communication standards. UE may be virtually any device that transmits and receives information, including as additional examples a driver assistance module in a vehicle, an emergency transponder, a pager, a satellite television receiver, a networked stereo receiver, a computer system, music player, or virtually any other device. The techniques discussed below may also be implemented in other devices, such as a base station or other network controller that communicates with the UE.

Aspects of the present disclosure are directed to a dual hysteretic control loop for an envelope tracking device which improves power efficiency of a power amplifier. The control loop ensures that most of the output current comes from at least one of two switches in the envelope tracking device. Aspects of the present disclosure provide improved efficiency through adjustment of thresholds and tuning of hysteresis in the envelope tracking device.

Figure 1:
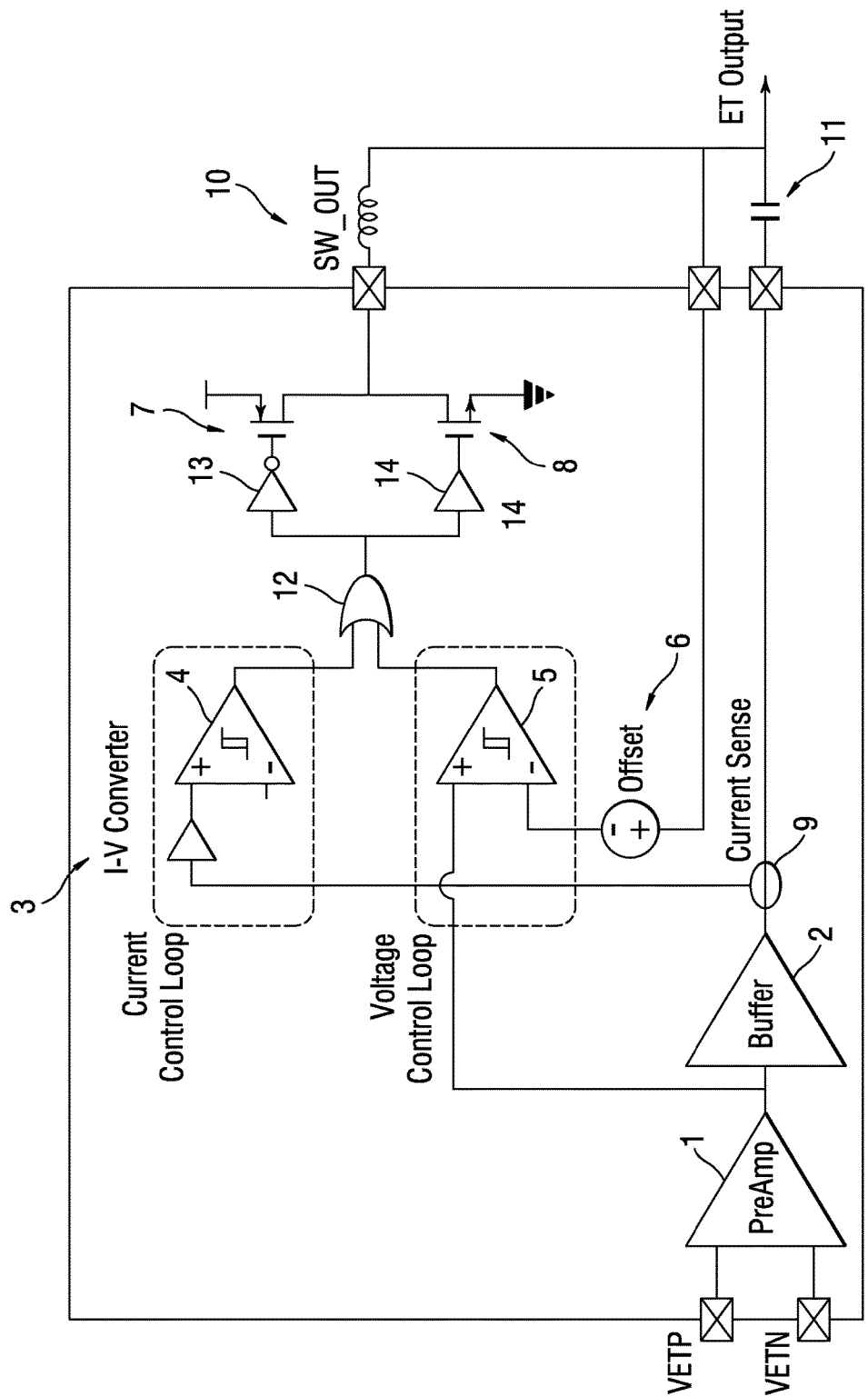
FIG. 1 is an exemplary schematic diagram of an envelope tracking device.

FIG. 1 is an exemplary schematic diagram of an envelope tracking (ET) device. The envelope tracking device includes a linear preamplifier 1, a linear buffer 2, a current-to-voltage (IV) converter 3, a first hysteretic comparator 4, a second hysteretic comparator 5, a tunable voltage offset 6, a high side switch 7, a low side switch 8, a buffer output current sensor 9, an external inductor 10, and an AC coupling capacitor 11. The inductor 10 is included to maintain a constant current and the coupling capacitor 11 is included to create a voltage offset between ET Output and Buffer 2 output.

The current control loop, which is formed by the IV converter 3 and the first hysteretic comparator 4, ensures that most of the output current from the ET device comes from the high side switch 7 and low side switch 8. The first hysteretic comparator 4 in the current control loop senses the output from the linear buffer 2 after this output is converted from a current to a voltage by the IV converter 3. When the output from the linear buffer 2 is greater than a predetermined threshold, the output of the first hysteretic comparator 4 transitions to a high state, which causes the OR gate 12 to which the output of the first hysteretic comparator 4 is connected, to also transition to a high state. The output of the OR gate 12 is connected to two buffers 13, 14 which drive the output switches 7,8. Therefore, when the output of the OR gate 12 is high, the buffer 14 connected to the switch 8 will output a low level and cause the switch 8 to turn off. The buffer 13 connected to the switch 7 is an inverting buffer. Therefore, when the output of the OR gate 12 is high, the output of the buffer 13 is low and the switch 7 is on. Conversely, when the output of the OR gate 12 is low, the output of the buffer 14 is high and the output of the buffer 13 is high too. Thus, switch 7 is off and switch 8 is on in this case. Using this circuit topology allows at least one of the output switches 7, 8 to be on, and increases or decreases the output current. While these descriptions employ positive logic (i.e., active high) negative logic (i.e., active low) can also be used without departing from the scope of the present advancements.

A constant voltage source (not shown) is connected to the inverting input to the first hysteretic comparator 4 to set the threshold voltage for the comparator 4. This constant voltage source also sets the hysteresis of the comparator 4, at least in part.

The predetermined threshold is programmable. Programming may be performed by adjusting a register bit in order to add a current and/or voltage offset via the inverting input of the hysteretic comparator 4. The register may form part of the comparator or may be a separate component as one of ordinary skill would recognize. The added offset may correspond to an offset current that is added to the input of the comparator. Alternatively, programming may be performed by using a level shifter to set a threshold. Hysteresis in the hysteretic comparator 4 may be set by the offset current as well.

A voltage control loop is formed by the second hysteretic comparator 5 and the tunable voltage offset 6, which is connected to the inverting input of the second hysteretic comparator 5. The second hysteretic comparator 5 in the voltage control loop senses a voltage difference between an input to the linear buffer 2 and a final ET output, adjusted with the tunable offset voltage 6. When the sensed voltage difference is greater than a predetermined threshold, the second hysteretic comparator 5 turns on and outputs a high level to the OR gate 12 in a same manner as described above with reference to the comparator 4. Thus, depending upon whether the output of the second hysteretic comparator 5 is high or low, at least one of the output switches 7, 8 is turned on and the output current is increased or decreased. By directly sensing the ET output, there is no need to have an accurate and fast analog voltage-to-current (VI) converter, which simplifies the design and reduces power consumption.

As in the first hysteretic comparator 4, the predetermined threshold is programmable in the second hysteretic comparator 5. Furthermore, the hysteretic voltage of both of the hysteretic comparators can be set at different values for different data rates in order to optimize power efficiency. The thresholds and hysteresis of both comparators can also be set independently of each other.

Removing the need for a VI converter reduces power consumption. An aspect of the present disclosure is to set the predetermined thresholds and the amount of hysteresis to levels that achieve further improvement in power efficiency. Power efficiency is measured as output power divided by total power. Thus, the greatest improvement in power efficiency is achieved by setting the thresholds and amount of hysteresis to values that minimize the power used by the envelope tracking circuit. The setting of the thresholds and the amount of hysteresis can be made through simulation of the circuit. Since the thresholds and hysteresis of the comparators 4 and 5 can also be modified during operation, another circuit may be included in the EU to measure output power, and the controller of the EU, may use this measurement value to adjust the thresholds and hysteresis in order to improve power efficiency.

In one example, the linear preamplifier 1 is divided into an operational amplifier (OpAmp) pre driver stage and a super source follower (SSF) stage. The SSF stage may be a source follower with an added internal feedback loop to reduce output impedance. The SSF stage drives a large capacitor loading from Power Amplifier (PA), which lowers the bandwidth specification on the OpAmp and thus uses less power. In exemplary aspects, only the SSF stage drives the large capacitor. The second hysteretic comparator 5 senses the voltage difference between the OpAmp output and ET output. When OpAmp output is higher than the ET output, this means that the SSF stage needs a larger current to drive output loading. The output of the second hysteretic comparator 5 goes high and turns on the high-side switch 7. In this manner, there is no need to sense the SSF output current and also no need to convert the ET output into a current as in previous implementations.

ET output noise can be lowered by adding feedforward capacitor arrays, which is equivalent to adding a zero or a notch filter to the ET output. Its central frequency can be tuned by digital control bits. Depending on selecting in-phase path or reverse-phase path, a central frequency can be moved lower or higher than the case without capacitor array. Varying delay buffer is added to match the phase of capacitor array input and switch driver output.

Figure 2:
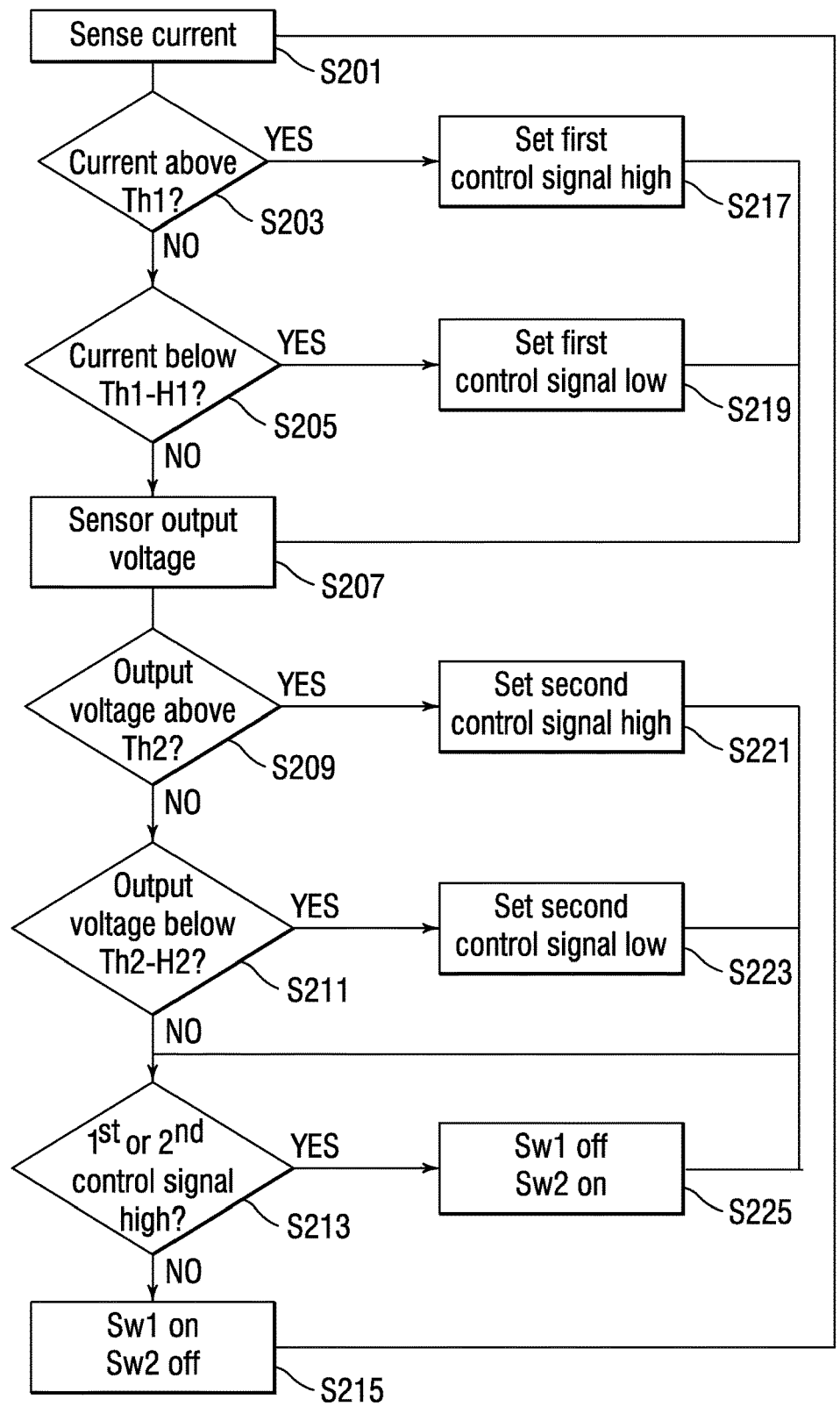
FIG. 2 is an algorithmic flowchart of operation of the envelope tracking device.

FIG. 2 is an algorithmic flowchart of operation of the envelope tracking device according to an exemplary aspect of the disclosure. In S201, the first hysteretic comparator 4 in the current control loop senses the output from the linear buffer 2 after this output is converted from a current to a voltage by the IV converter 3. When the output from the linear buffer 2 is greater than a predetermined threshold (Th 1) (YES in S203), in S217, the output of the first hysteretic comparator 4 transitions to a high state. In S207, the second hysteretic comparator 5 in the voltage control loop senses a voltage difference between an input to the linear buffer 2 and a final ET output, adjusted with the tunable offset voltage 6. When the sensed voltage difference is greater than a predetermined threshold (YES in S209), in S221 the second hysteretic comparator 5 turns on and outputs a high level. The OR gate 12 is also caused to transition to a high state. When the output of the OR gate 12 is high (YES in S213), the buffer 14 connected to the switch 8 will output a low level and cause the switch 8 to turn off (S225). Also, the output of the buffer 13 is low and the switch 7 (Sw1) is on to increase output current (S225). In this way, most ET output current will come from the switch block and improve the circuit power efficiency. Otherwise, when the output from the linear buffer 2 is less than or equal to a predetermined threshold (Th 1) (NO in S203), in S219, the first hysteretic comparator 4 transitions to a low state (YES in S205) when the current is below the difference in the threshold Th1 and the hysteresis value H1. When the sensed voltage difference is less than or equal to a predetermined threshold (NO in S209), in S223 the second hysteretic comparator 5 turns off and outputs a low level when the output voltage is below the difference in the threshold Th2 and the hysteresis value H2. The OR gate 12 is also caused to transition to a low state. When the output of the OR gate 12 is low (NO in S213), the buffer 14 connected to the switch 8 will output a high level and cause the switch 8 to turn on (S215). Also, the output of the buffer 13 is high and the switch 7 (Sw1) is off (S215) to reduce switch power output current. Thus, depending upon whether the output of the second hysteretic comparator 5 is high or low, at least one of the output switches 7, 8 is turned on.

The process described with reference to FIG. 2 is described sequentially for ease of understanding. However, one of ordinary skill will recognize that several of the blocks in FIG. 2 may be performed simultaneously, or in a different order than what is illustrated. For example, both the current and the voltage may be sensed simultaneously. As such, the process described with reference to FIG. 2 is merely exemplary and not limiting upon the present disclosure.

Advantages provided by the ET device include removing a requirement for an accurate and expensive VI converter, which saves power and reduces die area. Also, hysteresis voltages of current feedback loop and voltage feedback loop can be set separately in order to optimize power efficiency.

Figure 3:
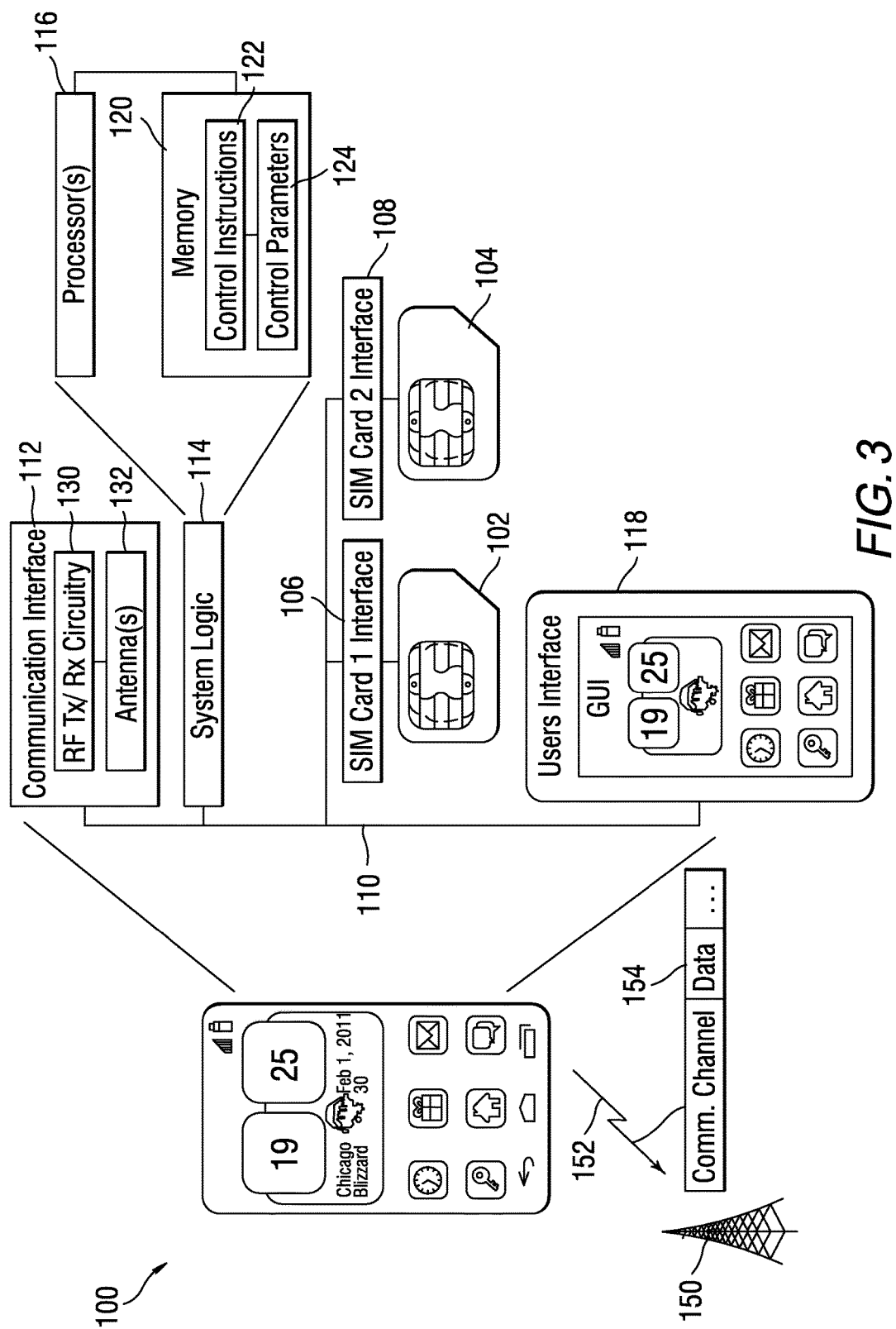
FIG. 3 is an exemplary diagram of a user equipment.

FIG. 3 shows a particular example of a UE 100 in which the direct connection techniques of the envelope tracking device may be implemented. In this particular example, the UE 100 is a smartphone, but as noted above, the UE may be virtually any type of electronic device capable of transmitting and receiving information. The UE 100 is in communication with a network controller 150, such as an enhanced Node B (eNB) or other base station. The network controller 150 and UE 100 establish communication channels 152 and exchange data 154 of any type. In this example, the UE 100 supports one or more Subscriber Identity Modules (SIMs), such as the SIM1 102 and the SIM2 104. Electrical and physical interfaces 106 and 108 connect SIM1 102 and SIM2 104 to the rest of the user equipment hardware, for example, through the system bus 110.

The UE 100 includes a communication interface 112, system logic 114, and a user interface 118. The system logic 114 may include any combination of hardware, software, firmware, or other logic. The system logic 114 may be implemented, for example, in a system on a chip (SoC), application specific integrated circuit (ASIC), or other circuitry. The circuits for the communication interface 112 and system logic 114 may be implemented using any known semiconductor technology, including by way of example, but not limited to CMOS, BiCMOS, and equivalents thereof. The system logic 114 is part of the implementation of any desired functionality in the UE 100. In that regard, the system logic 114 may include logic that facilitates, as examples, running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 may include a graphical user interface, touch sensitive display, voice or facial recognition inputs, buttons, switches, speakers and other user interface elements.

In the communication interface 112, Radio Frequency (RF) transmit (Tx) and receive (Rx) circuitry 130 handles transmission and reception of signals through the antenna(s) 132. The communication interface 112 may include one or more transceivers. The transceivers may be wireless transceivers that include modulation/demodulation circuitry, digital to analog converters (DACs), shaping tables, analog to digital converters (ADCs), filters, waveform shapers, filters, pre-amplifiers, power amplifiers and/or other logic for transmitting and receiving through one or more antennas, or (for some devices) through a physical (e.g., wireline) medium. In particular, the communication interface 112 may include the envelope tracking devices described previously herein. A wide variety of chipsets, available from Broadcom Corporation of Irvine Calif., may implement any desired functionality in the UE 100.

The UE 100 may implement any desired wired or wireless communication technologies. Accordingly, the transmitted and received signals may adhere to any of a diverse array of formats, protocols, modulations (e.g., QPSK, 16-QAM, 64-QAM, or 256-QAM), frequency channels, bit rates, and encodings. As one specific example, the communication interface 112 may support transmission and reception under the 4G/Long Term Evolution (LTE) standards. The enhancements described herein to the envelope tracking device are applicable to other communications technologies whether arising from the 3rd Generation Partnership Project (3GPP), GSM (R) Association, Universal Mobile Telecommunications System (UMTS), High Speed Packet Access (HSPA)+, or other partnerships or standards bodies. Note also that the UE 100 may implement any other desired communication technologies, including 802.11 a/b/g/n/ac/ad, Bluetooth, and Near Field Communications, as just a few examples.

The system logic 114 may include one or more processors 116 and memories 120. The memory 120 stores, for example, control instructions 122 that the processor 116 executes to carry out desired functionality for the UE 100. The control parameters 124 provide and specify configuration and operating options for the control instructions 122.

The invention claimed is:

1. An envelope tracking device comprising:
   circuitry configured to
   sense a current of an input stage of the envelope tracking device;
   sense an output voltage of the envelope tracking device; and
   turn on at least one of a first and a second output switches to generate an output current based on at least one of the sensed current and the sensed voltage, wherein
   the circuitry includes a current control loop to generate a first control voltage by comparing the sensed current to a first predetermined threshold, the first control voltage being used to control a state of the first and second output switches.

2. The envelope tracking device according to claim 1, wherein the circuitry includes a voltage control loop to generate a second control voltage by comparing the sensed output voltage difference to a second predetermined threshold, the second control voltage being used to control the state of the first and second output switches.

3. The envelope tracking device according to claim 2, wherein the circuitry includes a first hysteretic comparator configured to compare the sensed current to the first threshold in order to generate the first control voltage, the first hysteretic comparator having a first hysteresis.

4. The envelope tracking device according to claim 3, wherein the circuitry includes a second hysteretic comparator configured to compare the sensed output voltage difference to the second threshold in order to generate the second control voltage, the second hysteretic comparator having a second hysteresis.

5. The envelope tracking device according to claim 4, wherein the first threshold, the second threshold, the first hysteresis, and the second hysteresis are independently programmable.

6. The envelope tracking device according to claim 5, wherein the first threshold, the second threshold, the first hysteresis, and the second hysteresis are programmable through a programmable register.

7. The envelope tracking device according to claim 3, wherein the circuitry further includes a constant voltage source connected to an inverting input of the first hysteretic comparator and configured to set at least the first threshold.

8. The envelope tracking device according to claim 4, wherein the circuitry further includes a tunable voltage offset source connected to add a predetermined offset to the sensed output voltage in order to set the second threshold.

9. The envelope tracking device according to claim 2, wherein the circuitry further includes an OR gate connected between the first and second hysteretic comparators and the first and second output switches and configured to turn at least one of the first and second output switches on based on the first and second control voltages generated by the first and second hysteretic comparators.

10. The envelope tracking device according to claim 9, wherein the circuitry includes an inverting buffer connected between an output of the OR gate and the first switch and an inverting buffer connected between the output of the OR gate and the second switch.

11. The envelope tracking device according to claim 3, wherein the first hysteresis of the first hysteretic comparator is set using an offset current or an offset voltage.

12. The envelope tracking device according to claim 4, wherein the second hysteresis of the second hysteretic comparator is set using an offset current or an offset voltage.

13. An envelope tracking device comprising:
   circuitry configured to
   sense a current of an input stage of the envelope tracking device;
   sense an output voltage of the envelope tracking device; and
   turn on at least one of a first and a second output switches to generate an output current based on at least one of the sensed current and the sensed voltage, wherein the circuitry includes:
- a preamplifier stage configured to receive an input signal and to generate an output based on the input signal; and
- a buffer stage configured to receive the output of the preamplifier and to generate an output based on the output of the preamplifier.

14. The envelope tracking device according to claim 13, wherein the circuitry senses the sensed current at an output of the buffer stage.

15. The envelope tracking device according to claim 13, wherein the buffer stage is a supper source follower stage including a feedback loop to reduce an output impedance thereof.

16. The envelope tracking device according to claim 1, further comprising an inductor connected to the first and second switches to maintain a constant current at an output of the envelope tracking device.

17. The envelope tracking device according to claim 16, further comprising a bypass capacitor connected at the output of the envelope tracking device to block direct current.

18. The envelope tracking device according to claim 17, wherein the circuitry senses the output voltage at a connection point of the bypass capacitor and the inductor.

* * * * *